(12) United States Patent
Tada et al.

(10) Patent No.: US 10,490,491 B2
(45) Date of Patent: Nov. 26, 2019

(54) SEMICONDUCTOR DEVICE

(71) Applicant: Mitsubishi Electric Corporation, Chiyoda-ku (JP)

(72) Inventors: Kazuhiro Tada, Chiyoda-ku (JP); Kei Yamamoto, Chiyoda-ku (JP); Mariko Takahara, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/544,552

(22) PCT Filed: Dec. 25, 2015

(86) PCT No.: PCT/JP2015/086248
§ 371 (c)(1),
(2) Date: Jul. 19, 2017

(87) PCT Pub. No.: WO2016/125419
PCT Pub. Date: Aug. 11, 2016

(65) Prior Publication Data
US 2018/0269140 A1    Sep. 20, 2018

(30) Foreign Application Priority Data

Feb. 4, 2015 (JP) ................................ 2015-019921

(51) Int. Cl.
*H01L 23/495* (2006.01)
*H01L 23/00* (2006.01)
(Continued)

(52) U.S. Cl.
CPC ...... *H01L 23/49568* (2013.01); *H01L 21/565* (2013.01); *H01L 23/3121* (2013.01);
(Continued)

(58) Field of Classification Search
CPC . H01L 23/49568; H01L 24/49; H01L 21/565; H01L 23/3121; H01L 24/92;
(Continued)

(56) References Cited

U.S. PATENT DOCUMENTS

| 6,597,063 B1* | 7/2003 | Shimizu | H01L 23/24 257/687 |
| 2003/0057573 A1* | 3/2003 | Sekine | H01L 23/3107 257/787 |
| 2015/0371921 A1* | 12/2015 | Tanaka | H01L 21/565 257/712 |

FOREIGN PATENT DOCUMENTS

| JP | 11-243166 A | 9/1999 |
| JP | 2003-100986 A | 4/2003 |

(Continued)

OTHER PUBLICATIONS

International Search Report dated Mar. 15, 2016, in PCT/JP2015/086248, filed Dec. 25, 2015.

*Primary Examiner* — Caleen O Sullivan
(74) *Attorney, Agent, or Firm* — Oblon, McClelland, Maier & Neustadt, L.L.P.

(57) ABSTRACT

A lead frame extends from inside a sealing resin to outside the sealing resin, and is placed to make contact with a main surface of an insulating sheet opposite to a heat dissipation plate. A semiconductor element is jointed to at least a portion of a main surface of the lead frame opposite to the insulating sheet within the sealing resin. The surface of the insulating sheet in contact with the lead frame is inclined and lowered to move away from the lead frame in an end region including at least a portion of an outermost end in plan view of the insulating sheet. The sealing resin enters a region between the lead frame and the insulating sheet in the end region. The lead frame is flat at least within the sealing resin.

6 Claims, 10 Drawing Sheets

(51) Int. Cl.
  *H01L 23/31* (2006.01)
  *H01L 21/56* (2006.01)
  *H01L 23/36* (2006.01)
  *H01L 23/48* (2006.01)
  *H01L 23/433* (2006.01)
  *H01L 23/29* (2006.01)

(52) U.S. Cl.
  CPC .......... *H01L 23/36* (2013.01); *H01L 23/4334* (2013.01); *H01L 23/48* (2013.01); *H01L 23/49541* (2013.01); *H01L 23/49548* (2013.01); *H01L 24/49* (2013.01); *H01L 24/92* (2013.01); *H01L 23/295* (2013.01); *H01L 23/49513* (2013.01); *H01L 23/49524* (2013.01); *H01L 24/29* (2013.01); *H01L 24/32* (2013.01); *H01L 24/40* (2013.01); *H01L 24/45* (2013.01); *H01L 24/48* (2013.01); *H01L 24/73* (2013.01); *H01L 24/83* (2013.01); *H01L 24/84* (2013.01); *H01L 2224/29101* (2013.01); *H01L 2224/29111* (2013.01); *H01L 2224/29139* (2013.01); *H01L 2224/29144* (2013.01); *H01L 2224/29339* (2013.01); *H01L 2224/32245* (2013.01); *H01L 2224/371* (2013.01); *H01L 2224/3716* (2013.01); *H01L 2224/37147* (2013.01); *H01L 2224/37639* (2013.01); *H01L 2224/37655* (2013.01); *H01L 2224/40137* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/73221* (2013.01); *H01L 2224/73263* (2013.01); *H01L 2224/73265* (2013.01); *H01L 2224/8384* (2013.01); *H01L 2224/83801* (2013.01); *H01L 2224/84801* (2013.01); *H01L 2224/85439* (2013.01); *H01L 2224/85455* (2013.01); *H01L 2224/92157* (2013.01); *H01L 2224/92246* (2013.01); *H01L 2224/92247* (2013.01); *H01L 2924/1033* (2013.01); *H01L 2924/10253* (2013.01); *H01L 2924/10254* (2013.01); *H01L 2924/10272* (2013.01); *H01L 2924/13055* (2013.01); *H01L 2924/13091* (2013.01); *H01L 2924/181* (2013.01)

(58) Field of Classification Search
  CPC ..... H01L 23/49541; H01L 2224/48247; H01L 2224/83801; H01L 2224/48091; H01L 23/49548; H01L 23/4334; H01L 23/36; H01L 23/48; H01L 24/40; H01L 2224/45015; H01L 2224/29101; H01L 2224/37655; H01L 2224/85455; H01L 24/29; H01L 23/49513; H01L 24/83; H01L 2224/29339; H01L 24/84; H01L 2224/85439; H01L 23/49524; H01L 2224/37639; H01L 2224/84801; H01L 24/48; H01L 24/73; H01L 24/32; H01L 2224/92246; H01L 2224/29139; H01L 2924/13055; H01L 2224/45144; H01L 24/45; H01L 2224/73221; H01L 2224/29144; H01L 2224/45124; H01L 23/295; H01L 2224/45139; H01L 2924/10272; H01L 2924/1033; H01L 2224/8384; H01L 2224/29111; H01L 2924/10254; H01L 2224/45147; H01L 2224/92157; H01L 2924/10253; H01L 2924/13091; H01L 2224/92247; H01L 2224/73263; H01L 2224/32245; H01L 2224/3716; H01L 2224/371; H01L 2224/37147; H01L 2224/40137; H01L 2224/73265; H01L 2924/181
  USPC ......................................................... 257/675
  See application file for complete search history.

(56) References Cited

FOREIGN PATENT DOCUMENTS

| JP | 2008-28006 A | 2/2008 |
|----|--------------|--------|
| JP | 2011-198864 A | 10/2011 |
| JP | 2011-249465 A | 12/2011 |
| WO | 2012/073306 A1 | 6/2012 |

* cited by examiner (A)

(B)

SEMICONDUCTOR DEVICE

TECHNICAL FIELD

The present invention relates to semiconductor devices, and more particularly to a semiconductor device incorporating a power semiconductor element.

BACKGROUND ART

In recent years, a semiconductor device incorporating a power semiconductor element has been improved in performance and reduced in size, and required to have higher heat dissipation performance than has been conventionally possible. A power semiconductor element in such a semiconductor device is required to have high heat dissipation characteristics to surrounding components or to the outside of the components, while ensuring insulation from the surrounding components. For this purpose, a ceramic substrate that combines thermal conductivity and insulation properties is often used in such a semiconductor device. However, a ceramic substrate has a disadvantage of being brittle and having poor processability.

Meanwhile, an insulating sheet has been increasingly used recently in a semiconductor device required to have heat dissipation characteristics. An insulating sheet is made of resin filled with an inorganic powder filler made of ceramic particles, for example. In a power module of WO 2012/073306 (PTD 1), for example, an insulating sheet arranged to cover the upper surface of a heat dissipation plate improves efficiency of thermal conduction from a lead frame to the heat dissipation plate while ensuring electrical insulation between the lead frame and the heat dissipation plate.

In addition, the power module of WO 2012/073306 has a configuration in which a power semiconductor element, the heat dissipation plate, the insulating sheet and the like are sealed with epoxy resin. In this power module, the thickness of the lead frame varies between a region in which the power semiconductor element is placed directly thereon and the other region for electrical connection to the outside. By using such a lead frame that varies in thickness between the regions, a long so-called creepage distance, which is the distance between the lead frame and the heat dissipation plate in a direction along the surface of the heat dissipation plate, for example, can be ensured, whereby the electrical insulation between the lead frame and the heat dissipation plate can be further improved.

CITATION LIST

Patent Document

PTD 1: WO 2012/073306

SUMMARY OF INVENTION

Technical Problem

The lead frame that varies in thickness between the regions, as disclosed in WO 2012/073306, can improve the heat dissipation and insulation as described above, but suffers from higher manufacturing costs. In contrast, a lead frame in a mode of having a substantially uniform thickness as a whole but having been bent so as to extend in a different direction, for example, tends to flutter and be unstable during the installation thereof, and thus requires more steps such as the preparation of a jig for position control. If a lead frame in a mode of being flat as a whole (not having been bent) is used, the creepage distance between the lead frame and a heat dissipation plate cannot be ensured, which may result in reduced insulation between them.

The present invention was made in view of the above-described problems, and has an object to provide a semiconductor device capable of ensuring both insulation and heat dissipation characteristics between a lead frame and a heat dissipation plate without incurring higher manufacturing costs.

Solution to Problem

A semiconductor device of the present invention includes a sealing resin, a heat dissipation plate, an insulating sheet, a lead frame, and a semiconductor element. The heat dissipation plate is sealed within the sealing resin. The insulating sheet is mounted to make contact with one main surface of the heat dissipation plate within the sealing resin. The lead frame extends from inside the sealing resin to outside the sealing resin, and is placed to make contact with a main surface of the insulating sheet opposite to the heat dissipation plate. The semiconductor element is jointed to at least a portion of a main surface of the lead frame opposite to the insulating sheet within the sealing resin. The surface of the insulating sheet in contact with the lead frame is inclined and lowered to move away from the lead frame in an end region including at least a portion of an outermost end in plan view of the insulating sheet. The sealing resin enters a region between the lead frame and the insulating sheet in the end region. The lead frame is flat at least within the sealing resin.

Advantageous Effects of Invention

According to the present invention, the lead frame is flat and thus does not need to be subjected to a bending process and the like. In addition, the end region of the insulating sheet mounted on the heat dissipation plate is in a mode of being lowered to move away from the lead frame. Accordingly, both insulation and heat dissipation characteristics between the lead frame and the heat dissipation plate can be ensured without incurring higher manufacturing costs.

DESCRIPTION OF EMBODIMENTS

Embodiments of the present invention will be described below based on the drawings.

First Embodiment

First, the configuration of a power semiconductor device 100 of the present embodiment will be described using FIGS. 1 to 3.

Figure 1:
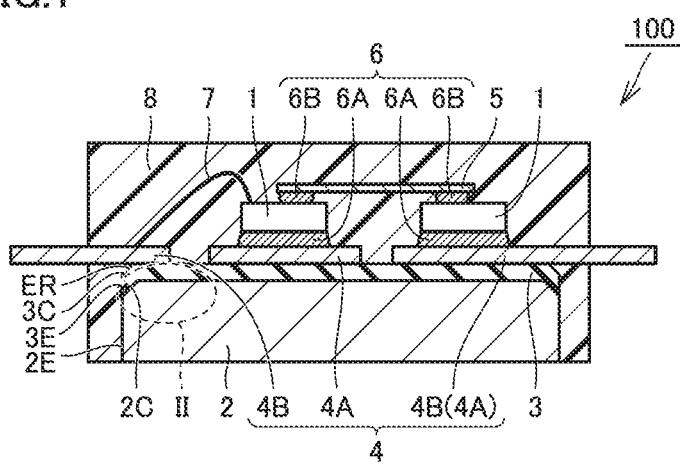
FIG. 1 is a schematic sectional view showing the configuration of a power semiconductor device of a first embodiment.

With reference to FIG. 1, semiconductor device 100 of the present embodiment mainly has a semiconductor element 1, a heat dissipation plate 2, an insulating sheet 3, a lead frame 4, and an inner lead 5.

Semiconductor element 1 is arranged so as to be mounted on a base formed of heat dissipation plate 2 in a rectangular parallelepiped shape and insulating sheet 3 in the shape of a flat plate, for example, with lead frame 4 interposed therebetween. Put conversely, heat dissipation plate 2 is a component for releasing heat generated during driving of semiconductor element 1 to the outside of semiconductor device 100, and is arranged below semiconductor element 1.

Insulating sheet 3 is sandwiched between semiconductor element 1 and heat dissipation plate 2, and between lead frame 4 and heat dissipation plate 2, in order to electrically insulate them from each other. Specifically, insulating sheet 3 is a flat plate-like component mounted to make contact with one main surface (upper main surface in FIG. 1) of heat dissipation plate 2. Because of its high insulation properties and excellent handleability, insulating sheet 3 is used for a device required to have heat dissipation characteristics such as power semiconductor device 100.

Lead frame 4 is a conductive component extending from a central portion of semiconductor device 100 having semiconductor element 1 mounted thereon to the outside of semiconductor device 100 in order to electrically connect the central portion of semiconductor device 100 and the outside of semiconductor device 100, for example. Lead frame 4 in FIG. 1 has an inner lead frame 4A and an outer lead frame 4B. Here, a region of lead frame 4 that is arranged only inside of semiconductor device 100 (for example, arranged only within a sealing resin 8 which will be described later, and not extending to the outside of semiconductor device 100) will be referred to as inner lead frame 4A, and a region of lead frame 4 that extends to the outside of semiconductor device 100 will be referred to as outer lead frame 4B. Inner lead frame 4A and outer lead frame 4B may be integrated with each other (see FIG. 3 which will be described later). For example, lead frame 4 on the right side in FIG. 1 includes both inner lead frame 4A and outer lead frame 4B (which is represented as "4B (4A)" in FIG. 1).

Lead frame 4 is basically placed to make contact with a main surface (upper main surface) of insulating sheet 3 opposite to a main surface of insulating sheet 3 making contact with heat dissipation plate 2. Semiconductor element 1 is joined by a joint material 6A to at least a portion of a main surface (upper main surface) of this lead frame 4 opposite to a main surface of lead frame 4 making contact with insulating sheet 3.

Inner lead 5 is in a similar mode to lead frame 4, but this is a conductive component for electrically connecting a plurality of semiconductor elements 1. Inner lead 5 is joined by a joint material 6B to at least a portion of a main surface (upper main surface) of semiconductor element 1 opposite to a main surface of semiconductor element 1 facing lead frame 4. Joint material 6A and joint material 6B here will be collectively referred to as a joint material 6.

Semiconductor element 1 and lead frame 4 may be electrically connected to each other by joint material 6A, and they may be electrically connected to each other by a bonding wire 7. For example, in FIG. 1, semiconductor element 1 on the left side and outer lead frame 4B on the left side are connected by bonding wire 7.

The respective components described above are almost entirely sealed with sealing resin 8 so as to be covered. In other words, the surfaces of all of semiconductor element 1, heat dissipation plate 2, insulating sheet 3, inner lead frame 4A, inner lead 5 and bonding wire 7 are almost entirely covered by sealing resin 8. However, outer lead frame 4B extending outward is only partially (the inner region) covered by sealing resin 8, and the other portion (particularly the outer region) is not covered by sealing resin 8. This uncovered portion of outer lead frame 4B can thereby be electrically connected to the outside of semiconductor device 100.

By covering the periphery of semiconductor element 1, sealing resin 8 can improve the reliability of various tests such as a heat cycle test, a power cycle test and a moisture proof reliability test.

Figure 2:
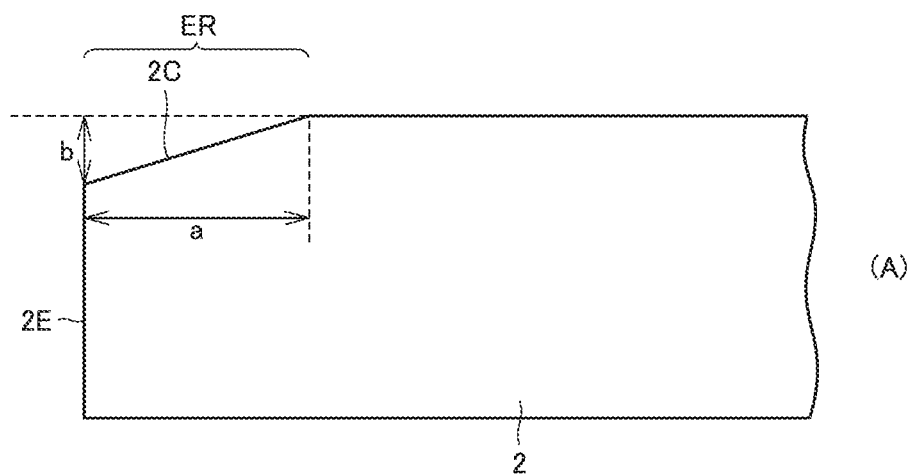
FIG. 2 shows a schematic enlarged sectional view (A) showing the shape and dimensions of a heat dissipation plate in a region II enclosed by the dotted line in FIG. 1 in the first embodiment, and a schematic enlarged sectional view (B) showing the shapes and dimensions of the heat dissipation plate and an insulating sheet in region II enclosed by the dotted line in FIG. 1 in the first embodiment.
Figure 2:
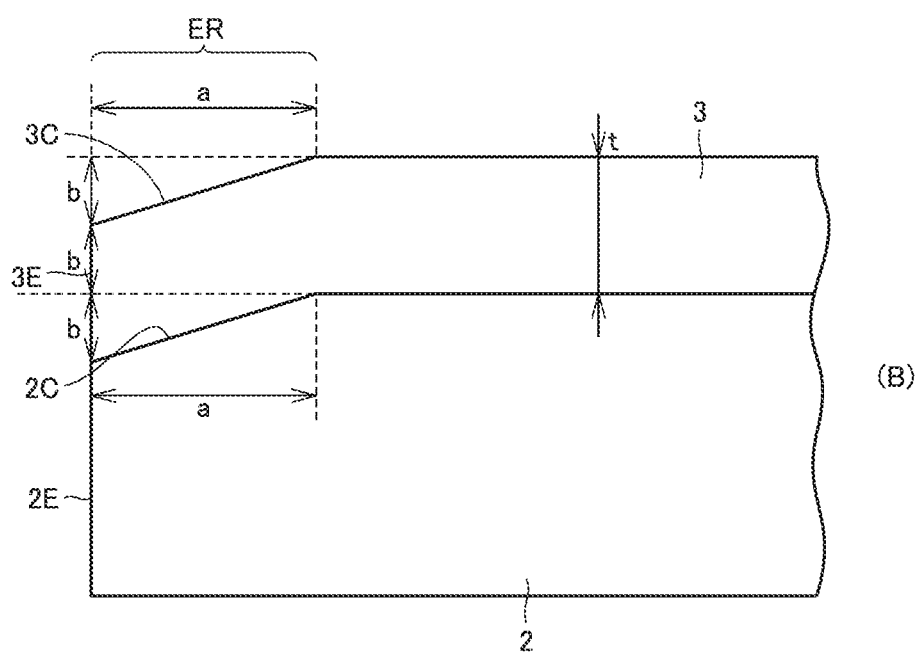

With reference to FIG. 1 and FIG. 2 (A), in the present embodiment, the top surface of heat dissipation plate 2 is lowered in an end region ER including at least a portion of an outermost end 2E (outermost edge portion) in plan view of heat dissipation plate 2 relative to a region other than end region ER (inner region in plan view), so as to be arranged on the side (lower side) opposite to the side making contact with insulating sheet 3. It is noted here that end region ER is not limited to outermost end 2E itself as one point (outermost edge portion) in the horizontal direction in FIG. 1 and FIG. 2 (A), for example, but also includes a region very close to this outermost end 2E.

Specifically, the top surface of heat dissipation plate 2 is in a mode of forming a C plane 2C (inclined plane) in end region ER. Heat dissipation plate 2 in end region ER thereby has a smaller thickness and a lower height of the top surface than in the other region. Since heat dissipation plate 2 has C plane 2C in end region ER, the amount of downward distance of heat dissipation plate 2 away from lead frame 4 (4B) monotonously increases toward outermost end 2E.

With reference to FIG. 2 (A), a dimension a of C plane 2C of heat dissipation plate 2 in end region ER of FIG. 1 in a direction along one main surface of heat dissipation plate 2 (horizontal direction in FIG. 2) is not less than 0.5 mm and not more than 2.0 mm. In C plane 2C of heat dissipation plate 2 in end region ER of FIG. 1, a maximum value b of lowered distance of the top surface of heat dissipation plate 2 relative to the region other than end region ER is not less than 0.025 mm and not more than 0.25 mm. C plane 2C is the lowest at its outermost end 2E relative to a region other than C plane 2C.

With reference to FIG. 1 and FIG. 2 (B), insulating sheet 3 on the upper surface of heat dissipation plate 2 basically has a substantially uniform thickness t as a whole. Thus, an (upper) surface of insulating sheet 3 making contact with lead frame 4 (4B) is inclined and lowered to move downward away from lead frame 4 (4B) in end region ER including a portion of an outermost end 3E (outermost edge portion) in plan view, so as to follow the lowered region of heat dissipation plate 2 in end region ER as described above.

Specifically, the top surface of insulating sheet 3 is in a mode of forming a C plane 3C (inclined plane) in end region ER. Insulating sheet 3 in end region ER thereby has a smaller thickness and a lower height of the top surface than in the other region. Since insulating sheet 3 has C plane 3C in end region ER, the amount of downward distance of insulating sheet 3 away from lead frame 4 (4B) monotonously increases toward outermost end 3E.

It is noted here that outermost end 2E of heat dissipation plate 2 and outermost end 3E of insulating sheet 3 substantially overlap each other in plan view, and therefore, end region ER in which C plane 2C of heat dissipation plate 2 has been formed and end region ER in which C plane 3C of insulating sheet 3 has been formed are the same region. The substantial overlap between outermost end 2E of heat dissipation plate 2 and outermost end 3E of insulating sheet 3 in plan view facilitates positioning during bonding of insulating sheet 3 to heat dissipation plate 2. If insulating sheet 3 is larger than heat dissipation plate 2 in plan view, chipping of insulating sheet 3 may occur during handling operation after insulating sheet 3 has been mounted on heat dissipation plate 2, causing a problem in ensuring insulation.

With reference to FIG. 2 (B), a dimension a of C plane 3C of insulating sheet 3 in end region ER of FIG. 1 in a direction along the upper surface of insulating sheet 3 making contact with lead frame 4 (horizontal direction in FIG. 2) is not less than 0.5 mm and not more than 2.0 mm, similarly to dimension a of heat dissipation plate 2. In C plane 3C of insulating sheet 3 in end region ER of FIG. 2, a maximum value b of lowered distance of the top surface of insulating sheet 3 relative to the region other than end region ER is not less than 0.025 mm and not more than 0.25 mm. C plane 3C is the lowest at its outermost end 3E relative to a region other than C plane 3C. This is the result of C plane 3C of insulating sheet 3 being formed directly above C plane 2C of heat dissipation plate 2 so as to follow the shape of C plane 2C, because insulating sheet 3 has a substantially uniform thickness as a whole.

As the value of the above-described a of heat dissipation plate 2 increases, an insulating creepage distance of sealing resin 8 in a region sandwiched between lead frame 4 and heat dissipation plate 2 increases. The insulating creepage distance as used herein means the length of an insulating region sandwiched between lead frame 4 and heat dissipation plate 2, particularly along the surface of insulating sheet 3.

From this perspective, a high value of a of heat dissipation plate 2 is preferable. However, an excessively high value of a will result in an increased amount of sealing resin 8 sandwiched between lead frame 4 and heat dissipation plate 2 in end region ER. Since sealing resin 8 has low thermal conductivity, heat dissipation from lead frame 4 to heat dissipation plate 2 may be reduced. From this perspective, a low value of a of heat dissipation plate 2 is preferable. In view of the above, the value of heat dissipation plate 2 is preferably not less than 0.5 mm and not more than 2.0 mm as described above.

Furthermore, if C planes 2C and 3C are formed to overlap a portion of semiconductor element 1, the effect of dissipating heat of semiconductor element 1 at heat dissipation plate 2 may be reduced in that overlapped portion. From the perspective of suppressing such disadvantage and ensuring heat dissipation, it is preferable to form C planes 2C and 3C (only) outside the region in which semiconductor element 1 is placed in plan view.

As the value of the above-described b of heat dissipation plate 2 increases, the insulating creepage distance of sealing resin 8 in the region sandwiched between lead frame 4 and heat dissipation plate 2 increases. From this perspective, a high value of b of heat dissipation plate 2 is preferable. However, an excessively high value of b will cause C plane 2C to sag downward significantly, which may result in reduced adhesion of insulating sheet 3 directly above C plane 2C to heat dissipation plate 2. The reduced adhesion between heat dissipation plate 2 and insulating sheet 3 may lead to breakage of insulating sheet 3 during handling of heat dissipation plate 2. From this perspective, a low value of b of heat dissipation plate 2 is preferable.

In end region ER of heat dissipation plate 2, insulating sheet 3 mounted thereon needs to be tightly adhered to heat dissipation plate 2 at sufficient strength by absorbing the level difference due to C plane 2C. For this purpose, the value of the above-described b of heat dissipation plate 2 is more preferably approximately half the thickness t of insulating sheet 3. Thickness t of insulating sheet 3 is preferably not less than 0.05 mm and not more than 0.5 mm as will be described later. In view of all of the above, the value of the above-described b of heat dissipation plate 2 is preferably not less than 0.025 mm and not more than 0.25 mm as described above.

If the value of the above-described b of heat dissipation plate 2 is smaller than 0.025 mm, the effect of ensuring insulation between lead frame 4 and heat dissipation plate 2 by insulating sheet 3 is reduced. If the value of the above-described b is greater than 0.25 mm, the heat dissipation characteristics of heat dissipation plate 2 from lead frame 4, semiconductor element 1 and the like are reduced. From this perspective, too, the value of the above-described b of heat dissipation plate 2 is preferably not less than 0.025 mm and not more than 0.25 mm as described above.

End region ER of heat dissipation plate 2 is provided with an inclination gradient of not less than 1.25% and not more than 50%. The inclination gradient as used herein represents a percentage of a value obtained by dividing the value of b by the value of a. By providing end region ER of heat dissipation plate 2 with an inclination gradient within this range, insulating sheet 3 can be readily mounted on heat dissipation plate 2. If the inclination gradient exceeds 50%, damage may occur due to breakage or chipping of insulating sheet 3 during the mounting of insulating sheet 3 on heat dissipation plate 2, which may result in loss of the insulation properties of insulating sheet 3. If the inclination gradient falls below 1.25%, on the other hand, sealing resin 8 does not enter the gap between insulating sheet 3 and lead frame 4. If sealing resin 8 does not enter the gap between insulating sheet 3 and lead frame 4, the insulating creepage distance cannot be increased.

Figure 3:
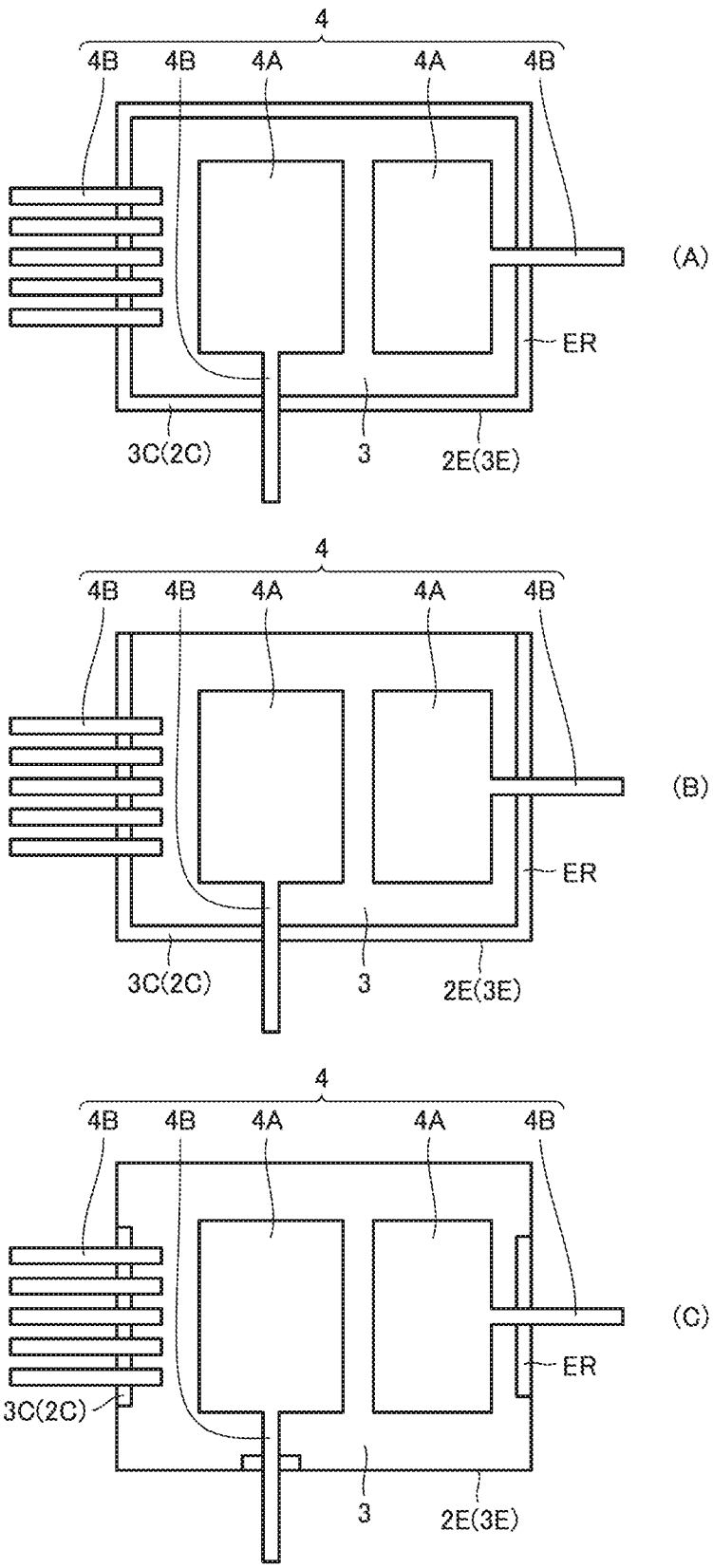
FIG. 3 shows a schematic plan view (A) showing a first example of a mode in which the C plane is formed as an end region in the heat dissipation plate and the insulating sheet of the first embodiment, a schematic plan view (B) showing a second example of the mode in which the C plane is formed as an end region in the heat dissipation plate and the insulating sheet of the first embodiment, and a schematic plan view (C) showing a third example of the mode in which the C plane is formed as an end region in the heat dissipation plate and the insulating sheet of the first embodiment.

With reference to FIG. 3 (A), in lead frame 4, each inner lead frame 4A completely covered by sealing resin 8, for example, has a rectangular shape (relatively close to a square) in which the height and width are not substantially different in length in plan view. In contrast, each outer lead frame 4B at least partially protruding outside of sealing resin 8 has a bar shape in plan view, and extends to the outside of semiconductor device 100 so as to (orthogonally) intersect outermost ends 2E and 3E in plan view.

As shown in FIG. 3 (A), C plane 2C and C plane 3C in end region ER may be formed around the entire periphery (outermost ends 2E and 3E) in plan view of heat dissipation plate 2 and insulating sheet 3. However, with reference to FIG. 3 (B), out of the four outermost end surfaces (four surfaces) of the rectangular plane shape of heat dissipation plate 2 and insulating sheet 3, for example, C plane 2C and C plane 3C may be formed only at the surfaces intersected by outer lead frames 4B. Alternatively, with reference to FIG. 3 (C), out of the outermost end surfaces of the rectangular plane shape of heat dissipation plate 2 and insulating sheet 3, for example, C plane 2C and C plane 3C may be formed only at portions intersected by outer lead frames 4B and in the vicinity thereof.

If the lowered portion is formed around the entire periphery as in FIG. 3 (A), there is no directionality of heat dissipation plate 2 and insulating sheet 3. Thus, there is no need to take into account the directions during manufacture whereby the manufacture is facilitated. In contrast, if the lowered portion is formed only partially as in FIG. 3 (C), the number of portions subjected to an end thinning process is reduced, whereby processing costs can be reduced.

In any case, in the present embodiment, C planes 2C and 3C are formed at least partially around the periphery (outermost ends 2E and 3E) in plan view of heat dissipation plate 2 and insulating sheet 3. In particular, C planes 2C and 3C are formed in the end region including these outermost ends 2E and 3E so as to include at least a portion where outer lead frame 4B crosses these outermost ends 2E and 3E.

With reference again to FIG. 1, in the present embodiment, in end region ER of heat dissipation plate 2, sealing resin 8 is in the mode of digging into and entering a region between C plane 3C of insulating sheet 3 and lead frame 4 (4B) directly thereabove. In other words, top surface 3C in end region ER of insulating sheet 3 and the lower surface of lead frame 4 directly thereabove are almost completely covered by sealing resin 8.

In the present embodiment, lead frame 4 (4A, 4B) is flat as a whole. In other words, this lead frame 4 has not been subjected to a bending process, for example, and thus does not have a conspicuous bent portion (such as a portion bent at a right angle to the extension direction) and the like. More specifically, variation in position (coordinates) in the vertical direction in FIG. 1 of the top surface of this lead frame 4 is not more than 0.1 mm, for example, as a whole.

Next, the materials, sizes and the like of the respective components described above will be discussed in detail.

Semiconductor element 1 is a chip-like component having an element such as an IGBT (Insulated Gate Bipolar Transistor), a switching element such as a MOSFET (Metal Oxide Semiconductor Field-Effect Transistor) and a rectifying element such as a diode mounted thereon. Since an IGBT is an element that is driven by passage of a large current, semiconductor element 1 is driven as a power semiconductor element, and semiconductor device 100 having this element mounted thereon is a so-called power module.

A semiconductor chip forming semiconductor element 1 is preferably made of silicon (Si), for example. However, the semiconductor chip of semiconductor element 1 is more preferably made of, other than silicon, any one selected from the group consisting of silicon carbide (SiC), a gallium nitride-based material (for example, gallium nitride (GaN)), and diamond, for example. These are so-called wide band gap semiconductor materials having wider band gaps than silicon. Semiconductor element 1 formed using such a wide band gap semiconductor material can be applied to high temperature operation by passage of a large current through the mounted element such as an IGBT. Although two semiconductor elements 1 are arranged at a distance from each other in FIG. 1, this is not limiting, and any number of semiconductor elements 1 may be arranged (that is, only one semiconductor element 1, or three or more semiconductor elements 1 may be arranged).

Heat dissipation plate 2 is preferably made of any one selected from the group consisting of copper, aluminum, an alloy of copper or aluminum, and a complex of copper or aluminum, which have high thermal conductivities. As the alloy of copper or aluminum, an alloy of copper and molybdenum is used, for example. As the complex of copper or aluminum, a complex of aluminum and silicon carbide is used, for example.

The thickness of heat dissipation plate 2 is not particularly limited, but is preferably not less than 1 mm and not more than 5 mm, for example. A thickly formed heat dissipation plate 2 has a high heat capacity, and can distribute heat for dissipation, thereby increasing the heat dissipation. Specifically, if the thickness of heat dissipation plate 2 is not less than 1 mm, the heat is more widely distributed, which can further increase the heat dissipation performance. If the thickness of heat dissipation plate 2 is not more than 5 mm, the processability of heat dissipation plate 2 is improved (the process is made easier), which can keep the manufacturing costs low. Heat dissipation plate 2 is processed to have a desired size by subjecting a metal plate having a certain thickness to press mold working. The press mold working causes a sag surface to occur in end region ER of heat dissipation plate 2. In the present embodiment, this sag surface is effectively used to form C plane 2C.

Insulating sheet 3 has a structure in which thermosetting resin such as epoxy resin is filled with an inorganic powder filler (of ceramic particles) having high thermal conductivity. Thermosetting resin such as epoxy resin filled with an inorganic powder filler of ceramic particles is also used for sealing resin 8 which will be described later in detail. If epoxy resin filled with an inorganic powder filler is used as insulating sheet 3, and epoxy resin filled with an inorganic powder filler is also used as sealing resin 8, for example, insulating sheet 3 and sealing resin 8 react with each other at an interface with the same epoxy resin, thereby forming a strong interface.

Insulating sheet 3 is required to have high heat dissipation performance. It is effective to use an inorganic powder filler having high thermal conductivity in order to increase heat dissipation performance. Specifically, for insulating sheet 3, for example, an inorganic powder filler having insulation properties and high thermal conductivity, such as crystalline silica, alumina, silicon nitride, boron nitride or aluminum nitride can be used.

Thickness t of insulating sheet 3 is preferably not less than 0.05 mm and not more than 0.5 mm. An inorganic powder filler having a maximum particle size of not less than 0.05 mm and not more than 0.15 mm is often used for insulating sheet 3. The maximum particle size of the inorganic powder filler as used herein means a maximum value of the dimension of a straight line drawn inside the inorganic powder filler (linear dimension inside the inorganic powder filler in a projection thereof). Thus, insulating sheet 3 thinner than 0.05 mm will be thinner than the maximum particle size of the inorganic powder filler contained in the insulating sheet, which may result in significantly reduced insulation properties of insulating sheet 3. Insulating sheet 3 thicker than 0.5 mm, on the other hand, has good insulation properties but increased thermal resistance, and may have reduced heat dissipation performance. From the perspective described above, thickness t of insulating sheet 3 is preferably not less than 0.05 mm and not more than 0.5 mm. It is noted that insulating sheet 3 does not need to be formed of a single layer, but may be configured to have a plurality of stacked layers having different thermal conductivities, for example.

As described above, insulating sheet 3 is made of a resin material as a base. Thus, the difference in coefficient of linear expansion between insulating sheet 3, and sealing resin 8 and heat dissipation plate 2 is reduced as compared to the case where insulating sheet 3 is made of a ceramic material used for a substrate of a common semiconductor device, for example. Accordingly, the cracking of resin and interfacial peeling of insulating sheet 3 due to a heat cycle can be suppressed as compared to the case where insulating sheet 3 is a ceramic material.

Insulating sheet 3 made of a resin material as a base also functions an adhesive. Thus, during thermosetting that is performed in a step of sealing semiconductor device 100 which will be described later, insulating sheet 3 is bonded to be tightly adhered to lead frame 4, heat dissipation plate 2 and sealing resin 8. Thus, there is no need to apply an adhesive to one and the other main surfaces of insulating sheet 3 for bonding to lead frame 4, heat dissipation plate 2 and sealing resin 8. The adhesive causes an increase in thermal resistance. By not applying the adhesive, therefore, increase in thermal resistance between insulating sheet 3, and lead frame 4, heat dissipation plate 2 and sealing resin 8 can be suppressed, so that semiconductor device 100 having high heat dissipation performance can be obtained.

Next, both lead frame 4 and inner lead 5 are preferably made of any one selected from the group consisting of copper, iron, a copper alloy and an iron alloy, for example. Of these, it is particularly preferable to use copper or a copper alloy. The use of these can achieve particularly improved thermal conductivity and electrical conductivity of lead frame 4 and inner lead 5. Lead frame 4 and inner lead 5 may be formed by plating the surface of a base metal made of the above-described copper or the like with a thin film such as nickel, silver, or nickel-palladium-gold. By so doing, oxidation of the base metal can be suppressed, and a better joined state between the base metal and bonding wire 7 can be achieved.

In joint material 6, joint material 6A connecting lead frame 4 and semiconductor element 1 is preferably any one selected from the group consisting of solder, a sinterable filler mainly composed of silver, a brazing filler metal mainly composed of silver, a material including copper dispersed in tin, gold-tin mainly composed of gold, and a gold-based alloy such as gold-germanium. These are joint materials having high thermal conductivities and high electrical conductivities.

In joint material 6, joint material 6B connecting the plurality of semiconductor elements 1 by inner lead 5 is preferably any one selected from the group consisting of solder, a sinterable filler mainly composed of silver, a brazing filler metal mainly composed of silver, and a material including copper dispersed in tin. These are joint materials having high electrical conductivities.

Bonding wire 7 is preferably any one selected from the group consisting of aluminum, copper, gold, silver, and an alloy mainly composed of these metals.

As sealing resin 8, a material whose thermal expansion coefficient and elastic modulus have been adjusted by mixing of an inorganic powder filler such as fused silica, crystalline silica, aluminum oxide or silicon nitride into thermosetting resin such as epoxy resin is used. Of these, it is particularly preferable to use fused silica as a filler for sealing resin 8. Sealing resin 8 is not required to be thermally conductive. Thus, by including fused silica having low thermal conductivity but having a low thermal expansion coefficient in sealing resin 8, adjustment of the thermal expansion coefficient of the entire sealing resin 8 can be facilitated. It is noted that sealing resin 8 has a thermal conductivity of not less than 0.7 W/mK and not more than 0.9 W/mK (lower than the thermal conductivities of the other components forming semiconductor device 100).

Next, an example of a method of manufacturing semiconductor device 100 will be described using FIGS. 4 to 12.

Figure 4:
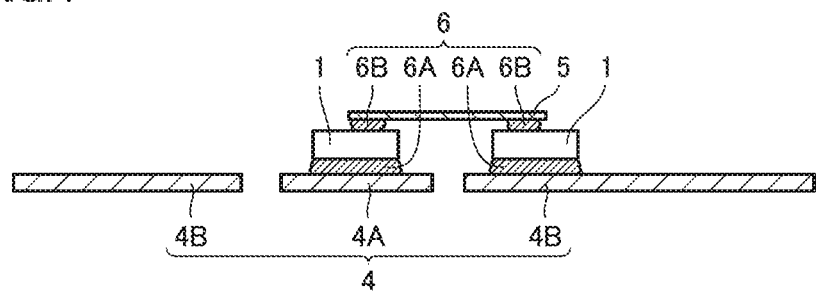
FIG. 4 is a schematic sectional view showing a first step of a method of manufacturing the power semiconductor device of the first embodiment.

With reference to FIG. 4, first, the plurality of semiconductor elements 1 are joined, at a distance from each other, to one (upper) main surface of lead frames 4A and 4B with joint material 6A interposed therebetween. This step is referred to as die bonding. During the die bonding, the plurality of semiconductor elements 1 are simultaneously joined by inner lead 5 via joint material 6B.

As semiconductor elements 1, a semiconductor chip made of silicon and having an IGBT mounted thereon, for example, and a semiconductor chip made of silicon and having a diode mounted thereon, for example, are jointed at a distance from each other to lead frame 4. Here, semiconductor element 1 having the IGBT mounted thereon has a size of 10 mm×10 mm×0.25 mm in plan view, for example, and semiconductor element 1 having the diode mounted thereon has a size of 10 mm×8 mm×0.25 mm in plan view, for example.

A solder material not including lead (99.25% by mass of tin, 0.75% by mass of copper) is used as joint material 6A, for example, to fixedly join semiconductor element 1 at a desired position of copper lead frame 4 which is flat (variation in coordinates in the thickness direction is not more than 0.1 mm as a whole) and which has been electroless nickel plated on its entire surface. Although not shown, an (upper) main surface of semiconductor element 1 opposite to the surface joined to lead frame 4 has been partially nickel-gold plated. The nickel-gold plated portions of the plurality of semiconductor elements 1 are electrically connected to inner lead 5 (0.6 mm thick) by joint material 6B as a solder material not including lead (99.25% by mass of tin, 0.75% by mass of copper). The plurality of semiconductor elements 1 are thereby electrically connected to one another via inner lead 5. The joint using joint material 6A on the lower surface of semiconductor element 1, and the joint using joint material 6B on the upper surface of semiconductor element 1 are collectively conducted using a solder reflow apparatus.

Figure 5:
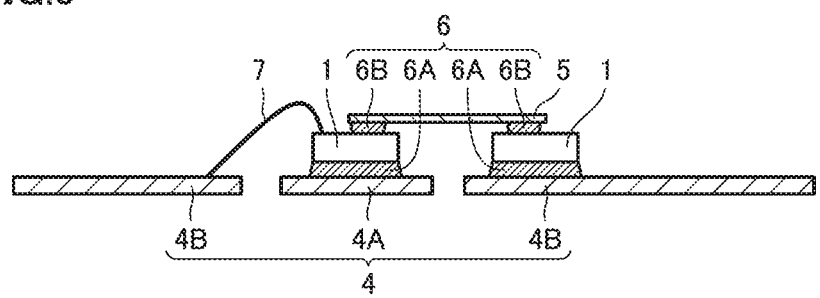
FIG. 5 is a schematic sectional view showing a second step of the method of manufacturing the power semiconductor device of the first embodiment.

With reference to FIG. 5, semiconductor element 1 and outer lead frame 4B (which is part of lead frame 4) are electrically connected by bonding wire 7. This step is referred to as wire bonding. Bonding wire 7 used here is made of aluminum and has a substantially circular shape whose cross section intersecting the direction in which bonding wire 7 extends has a diameter of 0.15 mm, for example.

Figure 6:
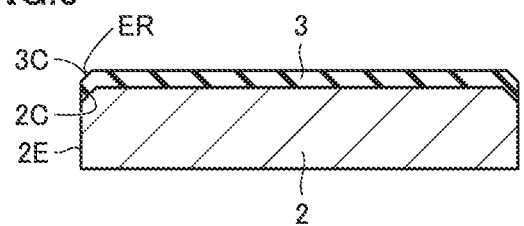
FIG. 6 is a schematic sectional view showing a third step of the method of manufacturing the power semiconductor device of the first embodiment.

With reference to FIG. 6, insulating sheet 3, which has been joined to one (upper) main surface of heat dissipation plate 2 by being heated and pressurized while being placed on the one main surface, is prepared as a different component than the component to which semiconductor element 1 and the like have been joined as shown in FIG. 5. This step of heating and pressurizing insulating sheet 3 on heat dissipation plate 2 is referred to as a pressing step. Here, there is prepared heat dissipation plate 2 in which the top surface is lowered downward in (end region ER including) outermost end 2E relative to the region other than end region ER whereby end region ER is provided with C plane 2C. Since insulating sheet 3 having a uniform thickness is joined onto heat dissipation plate 2, insulating sheet 3 is also provided with C plane 3C in end region ER.

By way of example, there is prepared heat dissipation plate 2 provided with C plane 2C having an inclination gradient of 10%, such that the top surface of heat dissipation plate 2 is formed to be lower by 0.1 mm at outermost end 2E than in the region other than end region ER (dimension b in FIG. 2 is 0.1 mm), and that end region ER (C plane 2C) is formed within a range of 1 mm from outermost end 2E (dimension a in FIG. 2 is 1 mm). This heat dissipation plate 2 is made of oxygen-free copper, for example, and has a size of 30 mm×20 mm×3 mm in plan view. Insulating sheet 3 is prepared to have a thermal conductivity of 12 W/mK and a thickness of 0.2 mm.

Although not shown, a silicone rubber sheet is placed on the upper main surface of heat dissipation plate 2, and insulating sheet 3 is placed on the silicone rubber sheet. In other words, the silicone rubber sheet is arranged so as to be sandwiched between heat dissipation plate 2 and insulating sheet 3. The silicone rubber sheet is made of a material having a heat resistance property and cushioning property at a temperature equal to or higher than the melting temperature of insulating sheet 3. In this state, insulating sheet 3 and heat dissipation plate 2 are pressurized from above insulating sheet 3 in the pressing step, and they are heated. Heating conditions during the pressing step include, for example, a temperature of 120° C., a pressure of 3 MPa, and a heating period of 3 minutes. At this time, insulating sheet 3 is not completely cured, and is melted again by temperature increase.

Figure 7:
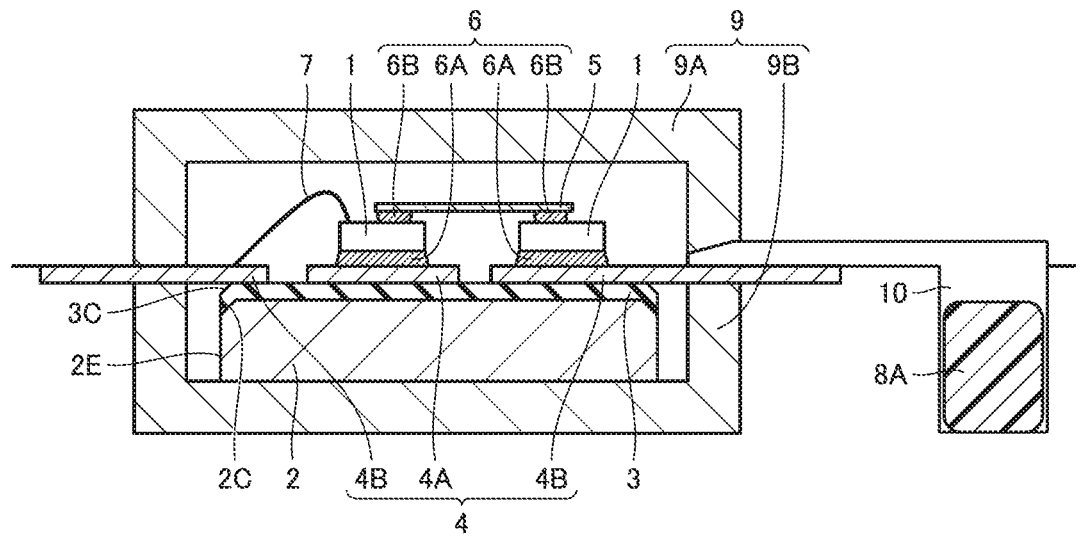
FIG. 7 is a schematic sectional view showing a fourth step of the method of manufacturing the power semiconductor device of the first embodiment.

With reference to FIG. 7, lead frames 4A and 4B to which semiconductor elements 1 have been joined and which have been subjected to the wire bonding step, and heat dissipation plate 2 which has been subjected to the pressing step and to which insulating sheet 3 has been joined are installed at a desired position inside a mold 9 for performing resin sealing (molding step). Mold 9 here is for performing resin sealing in a transfer molding step. Lead frame 4 and heat dissipation plate 2 described above are installed in a container-like component formed of an upper mold 9A and a lower mold 9B, and mold 9 is closed. Specifically, lead frame 4 is placed on insulating sheet 3 (on heat dissipation plate 2) so as to make contact with insulating sheet 3. Insulating sheet 3 is melted by a high-temperature atmosphere in mold 9, and is thereby joined to lead frame 4.

Here, a pot 10 connected to a cylinder that communicates from inside to outside of mold 9 is arranged outside of mold 9. Pot 10 is a component in which a sealing material tablet 8A serving as a material for performing resin sealing is set. Sealing material tablet 8A is made of a sealing resin material that has been solidified into the shape of a flat plate (tablet shape).

Figure 8:
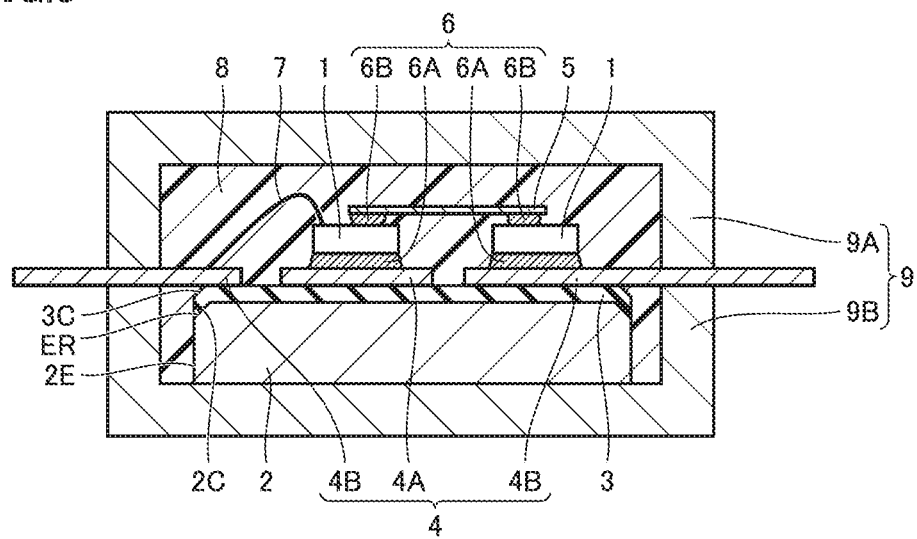
FIG. 8 is a schematic sectional view showing a fifth step of the method of manufacturing the power semiconductor device of the first embodiment.

With reference to FIG. 8, with mold 9 closed and sealing material tablet 8A of FIG. 7 installed in pot 10 of FIG. 7, sealing material tablet 8A in pot 10 is supplied into mold 9 while being pressurized. Sealing material tablet 8A in solid form is injected into a region between upper mold 9A and lower mold 9B of mold 9 continuous with the inside of the cylinder, while being gradually melted and increasing in fluidity by the heating. The resin material as fluid sealing material tablet 8A that has been injected into mold 9 is further heated and solidified by mold 9, then serves as sealing resin 8. As sealing resin 8 fills mold 9, the surfaces of all the respective components such as semiconductor element 1 and heat dissipation plate 2 in mold 9 are covered by solidified sealing resin 8.

Here, at least a portion of outermost end 2E of heat dissipation plate 2 has a lower top surface (a smaller thickness). For this reason, during the injection of molten sealing resin 8 into mold 9, a gap is formed between lead frame 4 and insulating sheet 3 (heat dissipation plate 2) at outermost end 2E and in end region ER in the vicinity thereof, and sealing resin 8 enters this gap as well. Thus, sealing resin 8 enters deeply so as to thoroughly cover the surfaces of lead frame 4 and insulating sheet 3 (heat dissipation plate 2) in end region ER as well.

In the transfer molding step, in order to cure sealing resin 8 and insulating sheet 3, the temperature is set to 180° C. and the pressure is set to 10 MPa in mold 9, and the heating period is set to 3 minutes, for example. However, the heating period in the transfer molding step can be set to any appropriate period depending on the reactivity of sealing resin 8 and insulating sheet 3.

Insulating sheet 3 is also melted as described above by temperature increase, and is thermoset by additional temperature increase in this transfer molding step.

Figure 9:
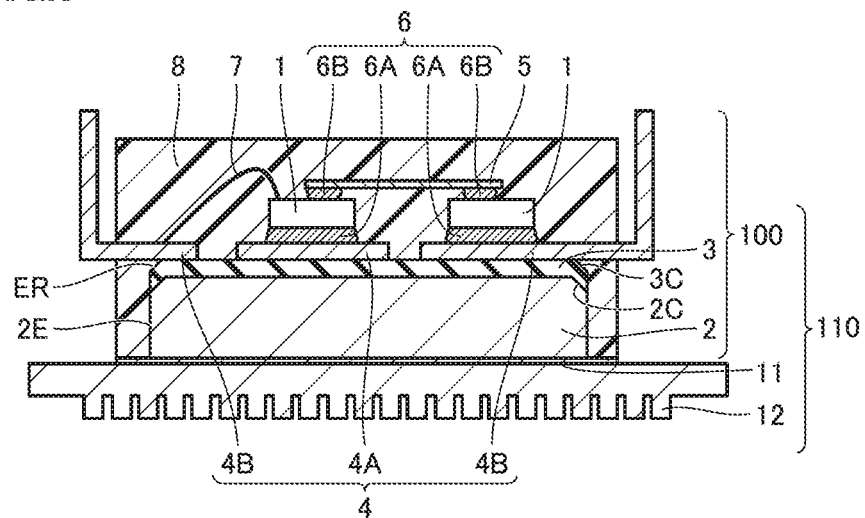
FIG. 9 is a schematic sectional view showing a sixth step of the method of manufacturing the power semiconductor device of the first embodiment.

With reference to FIG. 9, after sealing resin 8 has been solidified, semiconductor device 100 sealed with sealing resin 8 is removed from mold 9. It is noted that after semiconductor device 100 has been removed from mold 9, additional thermosetting may be performed by heating at 180° C. for 8 hours, for example, in order to further increase the degree of cure of sealing resin 8.

Although sealing resin 8 is supplied in the transfer molding step above, the method of supplying sealing resin 8 is not limited to this.

Next, an unnecessary portion of lead frame 4 is cut. This step is referred to as tie bar cutting. Then, outer lead frame 4B protruding outside of sealing resin 8 and extending in the direction along the main surface of heat dissipation plate 2, for example, is bent about 90° outside of sealing resin 8, for example, so as to extend upward in FIG. 9. Then, a joint thermal conducting material 11 is applied to a main surface (lower main surface) of heat dissipation plate 2 opposite to the main surface of heat dissipation plate 2 joined to insulating sheet 3, and heat sink 12 is joined to this opposite main surface with this material interposed therebetween. Semiconductor device 100 and heat sink 12 are now in a mode of being joined to each other. It is noted that heat sink 12 is a component for releasing heat generated during driving of semiconductor device 100 (such as semiconductor element 1) to the outside.

Joint thermal conducting material 11 is preferably fluid or thermosetting. If joint thermal conducting material 11 is silicone heat dissipating grease, for example, a load applied to join semiconductor device 100 and heat sink 12 to each other is appropriately optimized depending on the type of joint thermal conducting material 11 used. If joint thermal conducting material 11 is a heat dissipating adhesive, heating is performed at 125° C. for 30 minutes, for example, with the load being applied between semiconductor device 100 and heat sink 12, causing joint thermal conducting material 11 to be thermoset, whereby semiconductor device 100 and heat sink 12 are joined to each other.

It is noted that semiconductor device 100 and heat sink 12 may be joined to each other by tightening screws, or by restraining them with a leaf spring, as necessary.

In the present embodiment, the mode of semiconductor device 100 (without heat sink 12) may be a finally completed article (product), or the mode in which heat sink 12 has been connected to semiconductor device 100 (semiconductor device 110) may be a finally completed article (product).

Here, an example of a method of forming heat dissipation plate 2 and insulating sheet 3 having the particularly lowered portions (C planes 2C and 3C) will be described using FIGS. 10 to 12.

Figure 10:
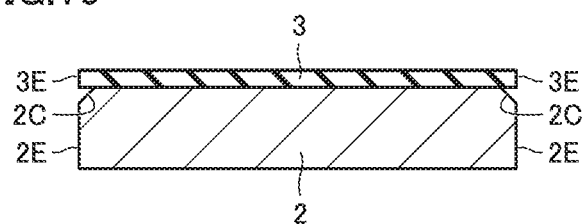
FIG. 10 is a schematic sectional view showing a first step of a method of manufacturing a configuration in which the insulating sheet is mounted on the heat dissipation plate shown in FIG. 6.

With reference to FIG. 10, there are prepared heat dissipation plate 2 in which the end region including outermost end 2E is lower than the other region and which has been provided with C plane 2C, and insulating sheet 3 overlapping heat dissipation plate 2 in plan view (having substantially the same shape and size as heat dissipation plate 2 in plan view). It is noted that C plane 2C of beat dissipation plate 2 is formed, for example, by using a mold shaped to be able to form C plane 2C during the molding thereof, or by performing a cutting process using a cutting tool such as a special chamfering cutter. Insulating sheet 3 is not provided with C plane 3C in FIG. 10, and has a substantially uniform thickness on its entire surface (is flat on its entire surface) including outermost end 3E. Then, insulating sheet 3 is mounted on one (upper) main surface of heat dissipation plate 2 so as to overlap heat dissipation plate 2.

Figure 11:
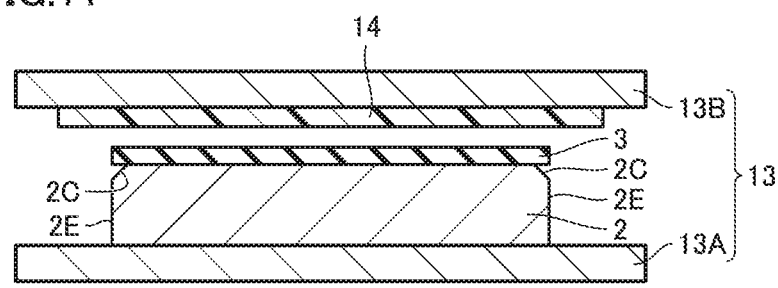
FIG. 11 is a schematic sectional view showing a second step of the method of manufacturing the configuration in which the insulating sheet is mounted on the heat dissipation plate shown in FIG. 6.

With reference to FIG. 11, heat dissipation plate 2 and insulating sheet 3 of FIG. 10 are placed at a desired position on a press lower face plate 13A of a pressing machine 13. A cushion sheet 14 is mounted on a (lower) surface of a press upper face plate 13B of pressing machine 13 facing press lower face plate 13A, at a position overlapping heat dissipation plate 2 and insulating sheet 3 in plan view.

Cushion sheet 14 is a component in the shape of a flat plate which is made of a material capable of being (compressively) deformed during heating and pressurization, and of deforming insulating sheet 3 by being pressed against insulating sheet 3. Specifically, cushion sheet 14 is preferably made of any one selected from the group consisting of silicone resin, acrylic resin and fluorine-based resin.

Figure 12:
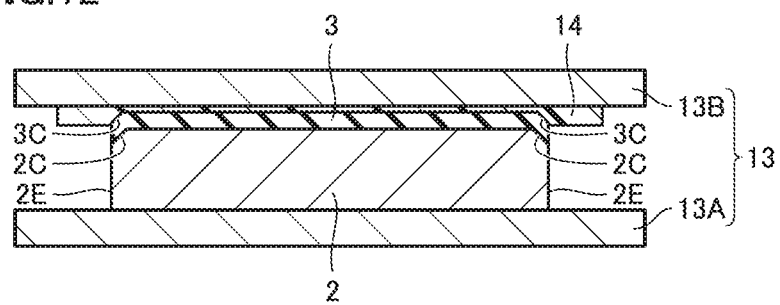
FIG. 12 is a schematic sectional view showing a third step of the method of manufacturing the configuration in which the insulating sheet is mounted on the heat dissipation plate shown in FIG. 6.

With reference to FIG. 12, press upper face plate 13B moves down to cause cushion sheet 14 to be tightly adhered to insulating sheet 3, whereby insulating sheet 3 is heated to its melting temperature while press upper face plate 13B applies a downward pressure to insulating sheet 3 and heat dissipation plate 2. It is noted that the heating temperature here is a low temperature such that the reaction of insulating sheet 3 proceeds and insulating sheet 3 is not thermoset. The heating period is also such that the reaction of insulating sheet 3 proceeds and insulating sheet 3 is not thermoset. Insulating sheet 3 is thereby deformed to follow the shape of C plane 2C of heat dissipation plate 2 and the like (such that C plane 3C is formed).

By removing heat dissipation plate 2 and the like from pressing machine 13, heat dissipation plate 2 having C plane 2C (and C plane 3C) is formed as shown in FIG. 6.

From the perspective of suppressing a disadvantage of insulating sheet 3 being tightly adhered to and unable to be peeled from cushion sheet 14, a mold release film may be arranged, although not shown, on the upper surface of insulating sheet 3 (the surface tightly adhered to cushion sheet 14).

Next, the function and effect of the present embodiment will be described with reference to a comparative example of FIG. 13.

Figure 13:
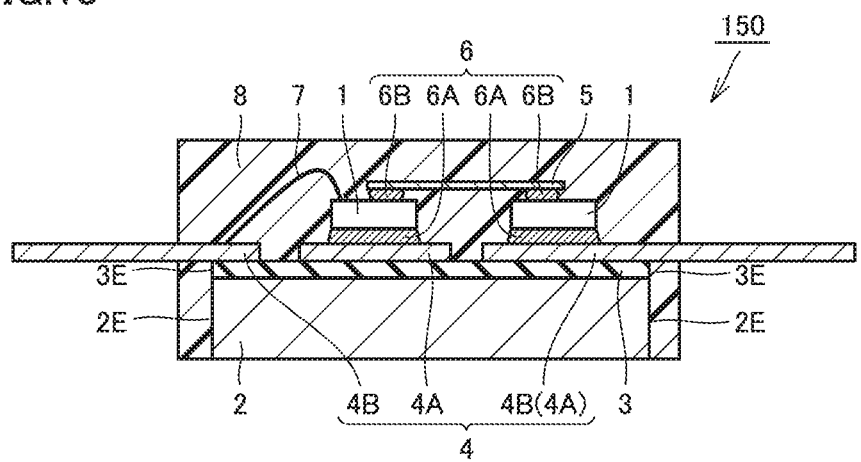
FIG. 13 is a schematic sectional view showing the configuration of a power semiconductor device of a comparative example.

With reference to FIG. 13, in a semiconductor device 150 of the comparative example, heat dissipation plate 2 does not have the shape of a lowered top surface (such as C plane 2C in FIG. 1) as in the present embodiment, in the end region including outermost end 2E in plan view. In other words, heat dissipation plate 2 in FIG. 13 has a substantially uniform (flat) thickness in the vertical direction of the figure as a whole. Since heat dissipation plate 2 is flat, insulating sheet 3 mounted on its main surface likewise does not have the shape of a lowered top surface (such as C plane 3C in FIG. 1) as in the present embodiment, in the end region including outermost end 3E in plan view, and is substantially flat as a whole.

It is noted that the configuration of semiconductor device 150 is otherwise substantially the same as that of semiconductor device 100, and thus the same elements are designated by the same reference signs and description thereof will not be repeated.

In the comparative example, the top of outermost end 3E of insulating sheet 3 is in contact with outer lead frame 4B. Thus, the distance (insulating creepage distance) between conductive outer lead frame 4B and (outermost end 2E of) heat dissipation plate 2 directly therebelow is reduced. The reduced insulating creepage distance between outer lead frame 4B and heat dissipation plate 2 may disadvantageously cause a short circuit between outer lead frame 4B and heat dissipation plate 2 during driving of semiconductor device 150.

Accordingly, in the present embodiment, the (upper) surface of insulating sheet 3 making contact with lead frame 4 is lowered to move downward away from lead frame 4 in end region ER including at least a portion of outermost end 3E in plan view of insulating sheet 3. In addition, sealing resin 8 has entered and is in a region between lead frame 4 and insulating sheet 3 (in other words, heat dissipation plate 2 directly therebelow) in this end region ER.

Thus, in the present embodiment, the insulating creepage distance between conductive lead frame 4 and conductive heat dissipation plate 2 directly therebelow is longer than in the comparative example. Furthermore, since sealing resin 8 has entered the region between lead frame 4 and heat dissipation plate 2 in end region ER, insulating sealing resin 8 is in a mode of having entered a region between lead frame 4 and insulating sheet 3 (on the upper surface of heat dissipation plate 2). Consequently, the present embodiment can achieve higher insulation between lead frame 4 and heat dissipation plate 2 than in the comparative example, and can ensure high performance of releasing heat generated by semiconductor element 1 and the like by heat dissipation plate 2 (can ensure both insulation and heat dissipation characteristics).

The configuration as described above is realized by the fact that the top surface of the heat dissipation plate is lowered in the end region including at least a portion of the outermost end in plan view of heat dissipation plate 2 relative to the region other than the end region of the heat dissipation plate, so as to be arranged opposite to the insulating sheet. This is because insulating sheet 3 is lowered at its outermost end 3E by following the shape of lowered outermost end 2E of heat dissipation plate 2.

Here, if outer lead frame 4B has a bent shape extending upward to increase the distance from heat dissipation plate 2 in end region ER of heat dissipation plate 2, the insulation between outer lead frame 4B and heat dissipation plate 2 can be readily ensured. In such a case, however, the number of steps required to form lead frame 4, such as performing a bending process on lead frame 4, will be increased, which may incur a higher manufacturing cost thereof. In addition, since lead frame 4 that has been subjected to a bending process tends to flutter and is poorly fixed in position during the installation thereof, the fluttering of lead frame 4 needs to be suppressed and managed. Furthermore, when mounting semiconductor element 1 on, or when joining bonding wire 7 to, the surface of lead frame 4 that has been subjected to a bending process, a special jig taking into account the level difference in lead frame 4 is required, which creates concerns about additional cost increase and reduced productivity.

However, in the present embodiment, lead frame 4 is flat as a whole and has not been subjected to a bending process at least within sealing resin 8 (although being bent after the resin sealing outside of sealing resin 8 in FIG. 9). Thus, the manufacturing cost of lead frame 4 can be reduced, and the possibility of fluttering of lead frame 4 within sealing resin 8 can be lowered. In addition, there is no need to use a special jig taking into account the level difference in lead frame 4, so that the productivity of subsequent steps such as the step of placing semiconductor element 1 can be improved.

In this way, the practical benefit of the present embodiment is that even if lead frame 4 is flat both insulation and heat dissipation characteristics can be improved by increasing the insulating creepage distance between lead frame 4 and heat dissipation plate 2 directly therebelow. This is because, by making lead frame 4 flat, the processability and handleability of lead frame 4 can be improved, and the insulation by the insulating creepage distance of end region ER of heat dissipation plate 2 can be ensured.

Second Embodiment

Figure 14:
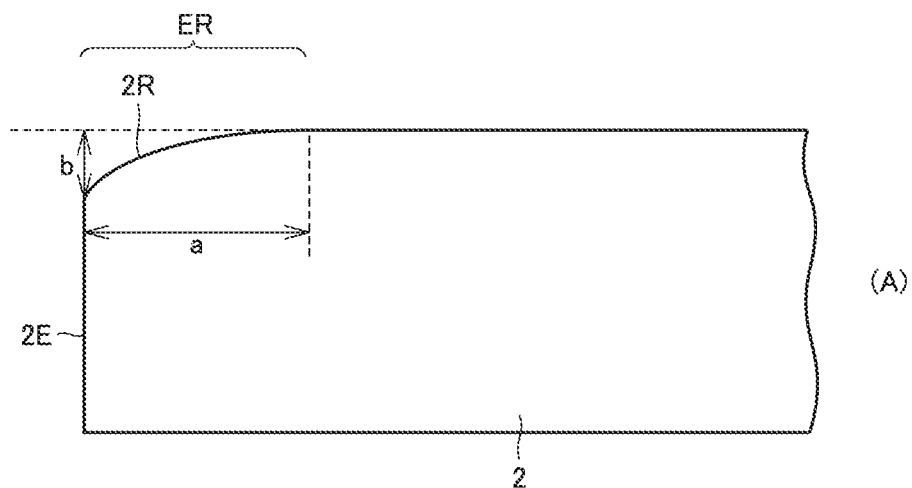
FIG. 14 shows a schematic enlarged sectional view (A) showing the shape and dimensions of the heat dissipation plate in a region corresponding to region II enclosed by the dotted line in FIG. 1 in a second embodiment, and a schematic enlarged sectional view (B) showing the shapes and dimensions of the heat dissipation plate and the insulating sheet in the region corresponding to region II enclosed by the dotted line in FIG. 1 in the second embodiment.
Figure 14:
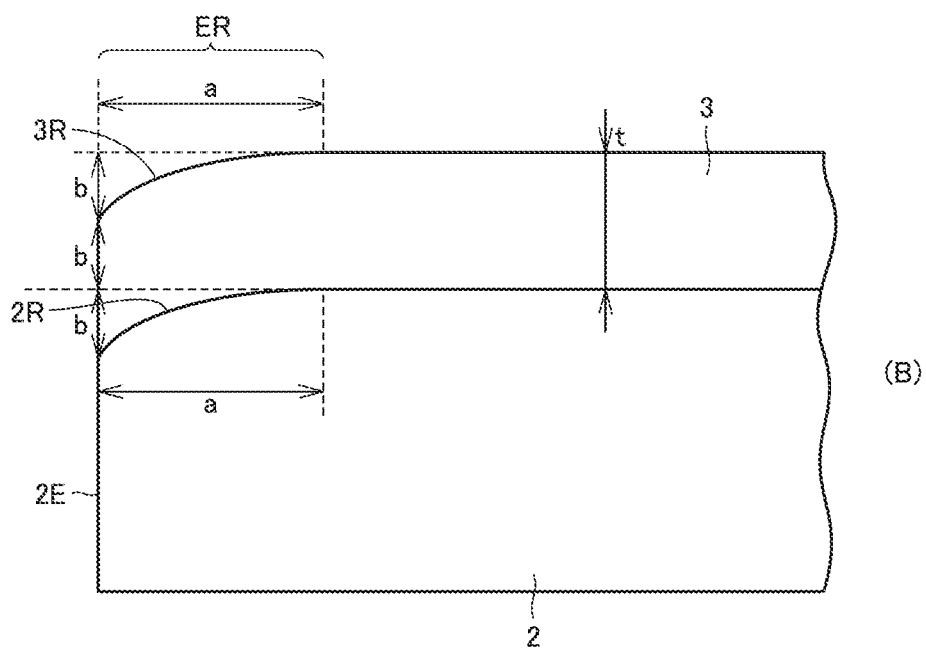

With reference to FIGS. 14 (A) and 14 (B), the present embodiment is different from the first embodiment in FIGS. 2 (A) and 2 (B) in that the main surfaces of heat dissipation plate 2 and insulating sheet 3 form curved surfaces 2R and 3R in the end region close to outermost ends 2E and 3E. In other words, curved surfaces 2R and 3R are formed in the present embodiment instead of C planes 2C and 3C in the first embodiment. Because of these curved surfaces 2R and 3R, heat dissipation plate 2 and insulating sheet 3 each have a lower top surface (smaller thickness) in end region ER including outermost ends 2E and 3E than in the region other than end region ER.

Curved surfaces 2R and 3R may have a spherical shape, or a curved surface shape other than the spherical shape. Since insulating sheet 3 has a substantially uniform thickness as a whole, curved surface 3R of insulating sheet 3 is formed to follow the shape of curved surface 2R of heat dissipation plate 2.

Dimension a of curved surfaces 2R and 3R in the direction along one main surface (horizontal direction in FIG. 14) and dimension b of curved surfaces 2R and 3R in the direction intersecting the main surface (vertical direction in FIG. 14) are basically similar in value to dimension a and dimension b in FIG. 2.

Although curved surfaces 2R and 3R have an upwardly projecting shape in FIG. 14, they may have a downwardly projecting shape.

It is noted that the configuration of the present embodiment is otherwise substantially the same as that of the first embodiment, and thus the same elements are designated by the same reference signs and description thereof will not be repeated.

Next, the function and effect of the present embodiment will be described. The present embodiment can produce the following function and effect in addition to those of the first embodiment.

By forming end region ER as a curved surface as in the present embodiment, even if this has the same dimensions a and b as those in the first embodiment, the insulating creepage distance between outer lead frame 4B and heat dissipation plate 2 directly therebelow can be increased as compared to the case where end region ER has a planar shape as in the first embodiment. In addition, in the present embodiment, since end region ER is formed to have a curved shape, the possibility of insulating sheet 3 being peeled from heat dissipation plate 2 in end region ER can be reduced as compared to the first embodiment in which end region ER is formed as a C plane.

Third Embodiment

Figure 15:
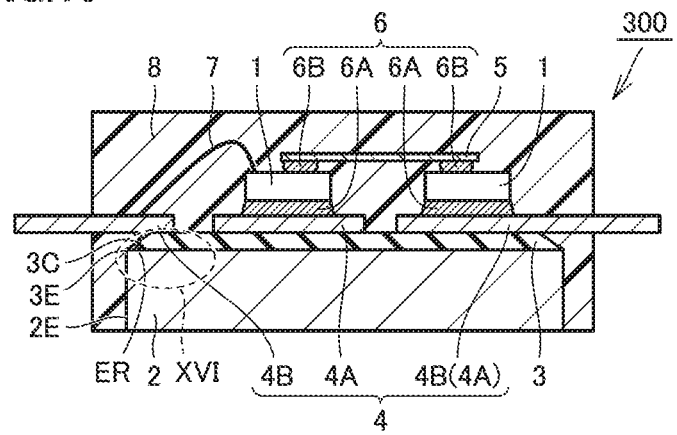
FIG. 15 is a schematic sectional view showing the configuration of a power semiconductor device of a third embodiment.
Figure 16:
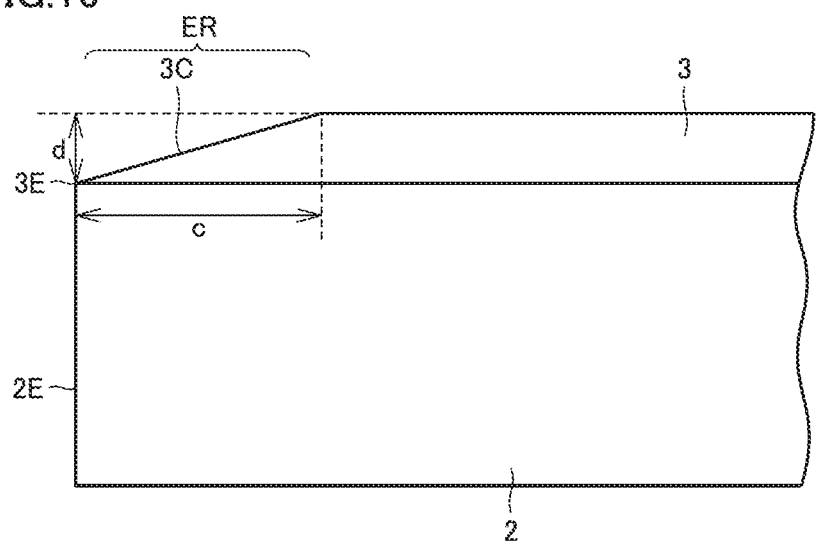
FIG. 16 is a schematic enlarged sectional view showing the shapes and dimensions of the heat dissipation plate and the insulating sheet in a region XVI enclosed by the dotted line in FIG. 15 in the third embodiment.

With reference to FIGS. 15 and 16, a semiconductor device 300 of the present embodiment is different from semiconductor device 100 of the first embodiment (FIG. 1) in that heat dissipation plate 2 is flat as a whole including end region ER, and is not provided with C plane 2C whose top surface is lowered downward in end region ER relative to the other region.

Specifically, heat dissipation plate 2 in FIGS. 15 and 16 is flat such that its top surface is (substantially) equal in height between end region ER and the region other than end region ER. More specifically, variation in position (coordinates) in the vertical direction in FIG. 15 of the top surface of this heat dissipation plate 2 is not more than 0.1 mm, for example, as a whole. However, insulating sheet 3 mounted on the upper main surface of heat dissipation plate 2 is reduced in thickness and provided with C plane 3C in its end region ER. As a result, C plane 3C is inclined and lowered to move downward away from outer lead frame 4B thereabove in end region ER of insulating sheet 3 (similarly to the first embodiment). The amount of downward distance of insulating sheet 3 away from lead frame 4 (4B) monotonously increases toward outermost end 3E, and C plane 3C is formed to reach the lowermost surface of insulating sheet 3 at its outermost end 3E (such that outermost end 3E has a pointed sectional shape in FIG. 16).

In the present embodiment, unlike the first embodiment, C plane 3C is not formed to follow the shape of C plane 2C directly therebelow, but is formed such that insulating sheet 3 has a smaller thickness in end region ER than in the other region. C plane 3C of insulating sheet 3 is formed to have a thickness of substantially zero at outermost end 3E. Thus, outermost end 3E of insulating sheet 3 does not have a component in the vertical direction in FIG. 15 (and a component in the vertical direction in FIG. 15), and only has a component in the circumferential direction in plan view. However, this mode is not limiting, and C plane 3C may be formed such that outermost end 3E has a component in the vertical direction in FIG. 15.

With reference to FIG. 16, a dimension c of C plane 3C of insulating sheet 3 in end region ER of the present embodiment in a direction (horizontal direction in FIG. 16) along the upper surface making contact with lead frame 4 corresponds to dimension a of heat dissipation plate 2 in FIG. 2, and is not less than 0.5 mm and not more than 2.0 mm, similarly to dimension a in FIG. 2. In C plane 3C of insulating sheet 3 in end region ER of FIG. 16, a maximum value d of lowered distance of the top surface of insulating sheet 3 relative to the region other than end region ER corresponds to dimension b in FIG. 2, and is not less than 0.025 mm and not more than 0.25 mm, similarly to dimension b in FIG. 2.

It is noted that the configuration of the present embodiment is otherwise substantially the same as that of the first embodiment, and thus the same elements are designated by the same reference signs and description thereof will not be repeated.

Next, an example of a method of forming heat dissipation plate 2 and insulating sheet 3 having the lowered portion (C plane 3C) only in insulating sheet 3 in the present embodiment will be described using FIGS. 17 to 20.

Figure 17:
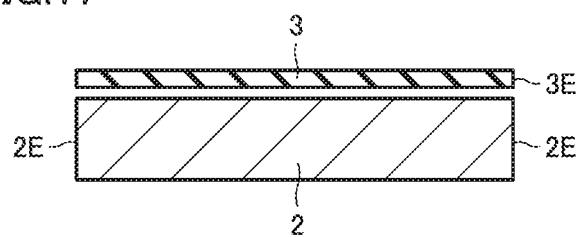
FIG. 17 is a schematic sectional view showing a first step of a method of manufacturing a configuration in which the insulating sheet is mounted on the heat dissipation plate in the third embodiment.

With reference to FIG. 17, heat dissipation plate 2 and insulating sheet 3 are prepared first. Insulating sheet 3 has a plane shape overlapping heat dissipation plate 2 in plan view (has substantially the same shape and size as heat dissipation plate 2 in plan view). In FIG. 17, C plane 3C is not formed, and heat dissipation plate 2 and insulating sheet 3 each have a substantially uniform (substantially flat) thickness on its entire surface including outermost ends 2E and 3E.

Figure 18:
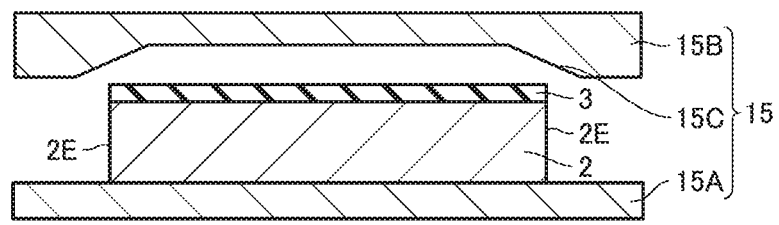
FIG. 18 is a schematic sectional view showing a second step of the method of manufacturing the configuration in which the insulating sheet is mounted on the heat dissipation plate in the third embodiment.

With reference to FIG. 18, insulating sheet 3 is mounted on one (upper) main surface of heat dissipation plate 2 so as to overlap heat dissipation plate 2. Heat dissipation plate 2 and insulating sheet 3 in FIG. 17 are placed at a desired position on a press lower face plate 15A of a pressing machine 15. A (lower) surface of a press upper face plate 15B of pressing machine 15 facing press lower face plate 15A is provided with an inclination 15C corresponding to the shape of C plane 3C to be formed on insulating sheet 3.

Figure 19:
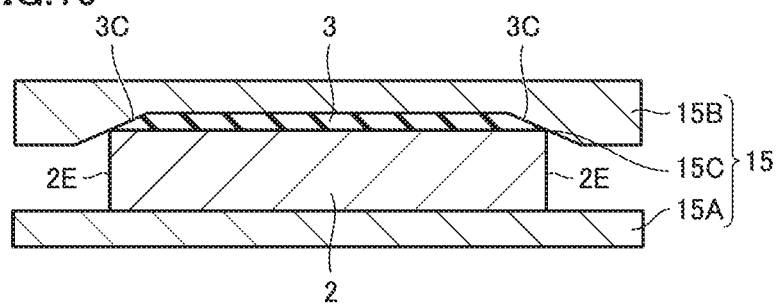
FIG. 19 is a schematic sectional view showing a third step of the method of manufacturing the configuration in which the insulating sheet is mounted on the heat dissipation plate in the third embodiment.

With reference to FIG. 19, press upper face plate 15B moves down to cause its lower surface (including the portion of inclination 15C) to be tightly adhered to insulating sheet 3, whereby insulating sheet 3 is heated to its melting temperature while press upper face plate 13B applies a downward pressure to insulating sheet 3 and heat dissipation plate 2. It is noted that the heating temperature here is a low temperature such that the reaction of insulating sheet 3 proceeds and insulating sheet 3 is not thermoset. The heating period is also such that the reaction of insulating sheet 3 proceeds and insulating sheet 3 is not thermoset. Insulating sheet 3 partially flows due to this heating and pressurization, and the shape of inclination 15C on the lower surface of press upper face plate 15B is transferred to insulating sheet 3, whereby C plane 3C in the end region as shown in FIGS. 15 and 16 is formed.

Here, from the perspective of suppressing a disadvantage of insulating sheet 3 being tightly adhered to and unable to be peeled from press upper face plate 15B, a mold release film may be arranged, although not shown, on the upper surface of insulating sheet 3. Insulating sheet 3 protruding from directly above heat dissipation plate 2 due to the flow is removed after being removed from pressing machine 15.

Figure 20:
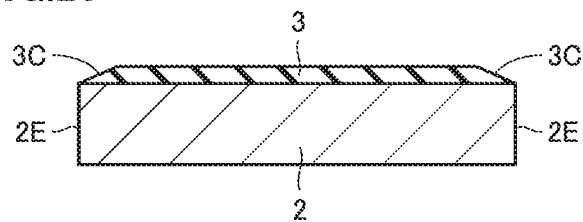
FIG. 20 is a schematic sectional view showing a fourth step of the method of manufacturing the configuration in which the insulating sheet is mounted on the heat dissipation plate in the third embodiment.

With reference to FIG. 20, by removing heat dissipation plate 2 and the like from pressing machine 15, heat dissipation plate 2 having insulating sheet 3 with C plane 3C mounted thereon is formed.

Next, the function and effect of the present embodiment will be described.

According to the present embodiment, the configuration in which the end region of insulating sheet 3 is thinned can be formed without forming a thinned (lowered top surface) region in the end region of heat dissipation plate 2. Since it is unnecessary to form the C plane in heat dissipation plate 2, it is that much easier than the first embodiment to provide insulating sheet 3 having a desired shape.

Even if the end region of heat dissipation plate 2 is not necessarily lowered and is flat, if at least insulating sheet 3 is lowered in the end region, then sealing resin 8 can be introduced into the region between insulating sheet 3 and outer lead frame 4B directly thereabove, thereby improving the insulation between lead frame 4 and heat dissipation plate 2. In addition, a long insulating creepage distance between lead frame 4 and heat dissipation plate 2 in the end region of insulating sheet 3 can be ensured.

Example 1

The adhesion of insulating sheet 3 to heat dissipation plate 2 in the pressing step (see FIG. 6) while insulating sheet 3 is mounted on one main surface of heat dissipation plate 2, as well as the insulation and heat dissipation of semiconductor device 100 formed by this heat dissipation plate 2 (see FIGS. 1 and 9) were evaluated, by varying values of the inclination gradient by varying values of dimensions a and b in FIGS. 2 (A) and 2(B) in the first embodiment.

Sample numbers 1 to 15 in Table 1 indicate samples of semiconductor device 100 in which epoxy resin-based insulating sheet 3 has been joined in the pressing step to one main surface of heat dissipation plate 2 made of oxygen-free copper (plane size is 30 mm×20 mm×3 mm). It is noted that insulating sheet 3 includes 58% by volume of boron nitride as an inorganic powder filler. Insulating sheet 3 has a thickness of 0.2 mm and a thermal conductivity of 12 W/mK. Table 1 shows results of evaluation of the adhesion between heat dissipation plate 2 and insulating sheet 3, the dielectric breakdown voltage (insulation) between outer lead frame 4B and heat dissipation plate 2 of semiconductor device 100, and the heat dissipation characteristics (heat dissipation) of semiconductor device 100 by heat dissipation plate 2, in each sample.

TABLE 1

| Sample number | a(mm) | b(mm) | Inclination Gradient | Adhesion | Insulation | Heat Dissipation |
|---|---|---|---|---|---|---|
| 1 | 0 | 0 | zero | Good | 2 kV | 100 |
| 2 | 0.3 | 0.1 | 33.3% | Good | 2 kV | 100 |
| 3 | 0.5 | 0.1 | 20.0% | Good | 4 kV | 100 |
| 4 | 1 | 0.1 | 10.0% | Good | 5 kV | 100 |
| 5 | 1.5 | 0.1 | 6.7% | Good | 6 kV | 100 |
| 6 | 2 | 0.1 | 5.0% | Good | 6 kV | 102 |
| 7 | 2.5 | 0.1 | 4.0% | Good | 6 kV | 115 |
| 8 | 1 | 0.01 | 1.0% | Good | 2 kV | 100 |
| 9 | 1 | 0.025 | 2.5% | Good | 5 kV | 100 |
| 10 | 1 | 0.1 | 10.0% | Good | 6 kV | 100 |
| 11 | 1 | 0.25 | 25.0% | Good | 6 kV | 100 |
| 12 | 1 | 0.3 | 30.0% | Peeled | — | — |
| 13 | 2 | 0.25 | 12.5% | Good | 6 kV | 103 |
| 14 | 0.4 | 0.25 | 62.5% | Peeled | — | — |
| 15 | 0.4 | 0.2 | 50.0% | Peeled | — | — |

The "Insulation" field in Table 1 indicates a maximum voltage at which the insulation could be maintained when an AC voltage was applied for one minute to each sample of semiconductor device 100 while the voltage was increased in increments of 0.5 kV, and the insulation was determined to be good when the value of this voltage was 4 kV or more. During the evaluation of the insulation, the voltage value was measured while the same potential was maintained throughout head frame 4, without cutting an unnecessary portion of lead frame 4 (without performing the tie bar cutting). The "Heat Dissipation" field in Table 1 indicates a relative value assuming that the thermal resistance of heat dissipation plate 2 having a uniform thickness as a whole (not provided with C plane 2C; dimensions a and b are both zero) (Sample 1) is 100, and the heat dissipation was determined to be low when the relative value was 110 or more.

From Table 1, when the value of a is low, the insulation tends to be reduced, and when the value of a is high, the heat dissipation tends to be reduced. When the value of b is low, the insulation tends to be reduced, and when the value of b is high, the adhesion between heat dissipation plate 2 and insulating sheet 3 is less likely to be ensured. When the inclination gradient represented as a value of b/a is high, the peeling tends to occur during the mounting of insulating sheet 3 on heat dissipation plate 2, and the adhesion between heat dissipation plate 2 and insulating sheet 3 is less likely to be ensured. When the inclination gradient is low, on the other hand, the insulation of insulating sheet 3 tends to be reduced.

In view of the above, it can be said that the optimal value of a is not less than 0.5 mm and not more than 2.0 mm, and the optimal value of b is not less than 0.025 mm and not more than 0.25 mm. Specifically, the samples with sample numbers 3, 4, 5, 6, 9, 10, 11 and 13 satisfy the above-described numerical conditions of a and b, and show good results of all of the adhesion, insulation and heat dissipation.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 semiconductor element; 2 heat dissipation plate; 2C, 3C C plane; 2E, 3E outermost end; 3 insulating sheet; 4 lead frame; 4A inner lead frame; 4B outer lead frame; 5 inner lead; 6, 6A, 6B joint material; 7 bonding wire; 8 sealing resin; 8A sealing material tablet; 9 mold; 9A upper mold; 9B lower mold; 10 pot; 11 joint thermal conducting material; 12 heat sink; 13, 15 pressing machine; 13A, 15A press lower face plate; 13B, 15B press upper face plate; 14 cushion sheet; 100, 110, 150 semiconductor device; ER end region.

The invention claimed is:
1. A semiconductor device comprising:
    a sealing resin;
    a heat dissipation plate sealed within the sealing resin and having a substantially flat main surface;
    an insulating sheet mounted to make contact with the main surface of the heat dissipation plate within the sealing resin;
    a lead frame extending from inside the sealing resin to outside the sealing resin, and placed to make contact with a main surface of the insulating sheet opposite to the heat dissipation plate; and
    a semiconductor element disposed on at least a portion of a main surface of the lead frame opposite to the insulating sheet within the sealing resin,
    a thickness of the insulating sheet is smaller in an end region of the insulating sheet proximate to an outermost edge of the heat dissipation plate than in a region of the insulating sheet other than the end region, a region is formed between an upper surface of the insulating sheet and the lead frame in the end region, and the insulating sheet does not extend beyond the outermost edge of the heat dissipation plate in the end region;
    the sealing resin entering the region between the lead frame and the upper surface of the insulating sheet in the end region, and
    the lead frame being flat at least within the sealing resin.
2. The semiconductor device according to claim 1, wherein
    a dimension of the end region of the insulating sheet in a direction along the surface of the insulating sheet in contact with the lead frame is not less than 0.5 mm and not more than 2.0 mm, and
    a maximum value of lowered distance of the surface of the insulating sheet in contact with the lead frame in the end region of the insulating sheet relative to a region other than the end region of the insulating sheet is not less than 0.025 mm and not more than 0.25 mm.
3. The semiconductor device according to claim 1, wherein the thickness of the insulating sheet in the end region monotonously increases in a direction toward an interior of the heat dissipation plate.
4. A semiconductor device comprising:
    a sealing resin;
    a heat dissipation plate sealed within the sealing resin and having a substantially flat main surface;

an insulating sheet mounted to make contact with the main surface of the heat dissipation plate within the sealing resin;

a lead frame extending from inside the sealing resin to outside the sealing resin, and placed to make contact with a main surface of the insulating sheet opposite to the heat dissipation plate; and a semiconductor element disposed on at least a portion of a main surface of the lead frame opposite to the insulating sheet within the sealing resin, a thickness of the insulating sheet is smaller in an end region of the insulating sheet proximate to an outermost edge of the heat dissipation plate than in a region of the insulating sheet other than the end region, the sealing resin entering a region between the lead frame and the insulating sheet in the end region, and the lead frame being flat at least within the sealing resin, wherein the thickness of the insulating sheet is substantially zero at the outermost edge of the heat dissipation plate.

5. The semiconductor device according to claim 4, wherein the thickness of the insulating sheet monotonously increases in a direction toward an interior of the heat dissipation plate in the end region.

6. The semiconductor device according to claim 4, wherein the insulating sheet does not extend beyond the outermost edge of the heat dissipation plate in the end region.

* * * * *